(12) United States Patent
Taracila et al.

(10) Patent No.: US 8,598,878 B2
(45) Date of Patent: Dec. 3, 2013

(54) INDUCTOR ASSEMBLY FOR A MAGNETIC RESONANCE IMAGING SYSTEM

(75) Inventors: Victor Taracila, Aurora, OH (US);
Fraser J. L. Robb, Aurora, OH (US);
Aleksey Zemskov, Aurora, OH (US)

(73) Assignee: General Electric Company, Schenectady, NY (US)

( * ) Notice: Subject to any disclaimer, the term of this patent is extended or adjusted under 35 U.S.C. 154(b) by 601 days.

(21) Appl. No.: 12/834,287

(22) Filed: Jul. 12, 2010

(65) Prior Publication Data
US 2012/0007601 A1 Jan. 12, 2012

(51) Int. Cl.
*G01V 3/00* (2006.01)

(52) U.S. Cl.
USPC .......................................................... 324/318

(58) Field of Classification Search
USPC .................................................. 324/300–322
See application file for complete search history.

(56) References Cited

U.S. PATENT DOCUMENTS

| | | | |
|---|---|---|---|
| 6,255,998 B1 * | 7/2001 | Podger | 343/867 |
| 6,469,674 B1 * | 10/2002 | Podger | 343/742 |
| 6,822,450 B2 | 11/2004 | Klinge et al. | |
| 6,853,342 B2 * | 2/2005 | Podger | 343/742 |

* cited by examiner

*Primary Examiner* — Dixomara Vargas
(74) *Attorney, Agent, or Firm* — The Small Patent Law Group; Dean D. Small (57) ABSTRACT

An inductor assembly includes an electrical conductor having a first end and an opposite second end, and a plurality of turns, each turn having a first lobe and a second lobe, the electrical conductor being formed into a lemniscate shape. A Radio Frequency (RF) coil including the lemniscate shaped inductor and a Magnetic Resonance Imaging (MRI) system including the lemniscate shaped inductor are also described herein.

20 Claims, 5 Drawing Sheets

INDUCTOR ASSEMBLY FOR A MAGNETIC RESONANCE IMAGING SYSTEM

BACKGROUND OF THE INVENTION

The subject matter disclosed herein relates generally to radio frequency (RF) coils, and more particularly to an inductor used in an RF coil.

Magnetic Resonance Imaging (MRI) systems include a magnet, such as a superconducting magnet that generates a temporally constant (i.e., uniform and static) primary or main magnetic field. MRI data acquisition is accomplished by exciting magnetic moments within the primary magnetic field using magnetic gradient coils. For example, in order to image a region of interest, the magnetic gradient coils are energized to impose a magnetic gradient to the primary magnetic field. Transmit radio-frequency (RF) coils are then pulsed to create RF magnetic field pulses in a bore of an MRI scanner to selectively excite a volume corresponding to the region of interest in order to acquire MR images of the region of interest using receive RF coils. During the transmission of the RF magnetic field pulses, the receive RF coils are decoupled or detuned. Decoupling of the receive coil array is achieved using decoupling circuits that include an inductor connected in parallel with a capacitor. The inductor and capacitor may also be combined in series or used alone in the phased array circuitry as a choke for RF currents in DC lines, in T/R switches, and/or Multiplexing Boards (MuxBoards). The magnetic field exhibited by these inductors must be confined within their physical dimensions so that no coupling occurs between the inductors and other components in the circuitry.

Conventional RF coils include usually include many inductors that are typically resonated with capacitors by creating parallel resonant tank circuits. In general, when the reactance of the capacitor is substantially equal to the reactance of the inductor the tank circuit is in resonance.

During operation, it is desirable to utilize an inductor having a relatively good magnetic field confinement. However, due to the structure of the conventional inductor, the conventional inductor may exhibit magnetic dipole radiation. For example, it is known that a closed loop is an excellent example of the magnetic dipole. Decomposed into multipoles, the closed loop has only a first term corresponding to the magnetic dipole, different from zero. By repeating the loop geometry along an axis, a spiral having an increased dipole moment and proportional to the number of turns is created. The conventional method of confining this type of inductor is to make the ends meet, thus creating a torus-shaped inductor. However, conventional torus-shaped inductors do not totally confine the magnetic field. Rather, in operation, the conventional torus-shaped inductor has a small, but important, magnetic dipole radiation component that is caused by a tilt in wrapping the single conductor around the torus surface. This tilt creates a certain magnetic dipole radiation that may affect the conventional torus-shaped inductor's coupling to neighboring components.

BRIEF DESCRIPTION OF THE INVENTION

In accordance with one embodiment, an inductor is provided. The inductor includes an electrical conductor having a first end and a second end, the electrical conductor being formed into a lemniscate shape.

In accordance with another embodiment, an Radio Frequency (RF) coil is provided. The RF coil includes a capacitor and an inductor coupled to the capacitor. The inductor includes an electrical conductor having a first end and a second end, the electrical conductor being formed into a lemniscate shape.

In accordance with a further embodiment, an MRI system is provided. The MRI system includes an RF coil. The RF coil includes a capacitor and an inductor coupled to the capacitor. The inductor includes an electrical conductor having a first end and a second end, the electrical conductor being formed into a lemniscate shape.

DETAILED DESCRIPTION OF THE INVENTION

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments described herein provide an inductor assembly that may be utilized to form a resonant circuit with a capacitor. The resonant circuit may be utilized in an a radio-frequency (RF) coil. By practicing at least one embodiment, the inductor assemblies described herein may be tuned prior to being installed in the MRI system, thus reducing the time and labor costs associated with installation and tuning. The various inductor assemblies may be implemented in connection with different types of magnetic resonance coils, for example surface coils, operating at different frequencies, thus having different wavelengths.

Figure 1:
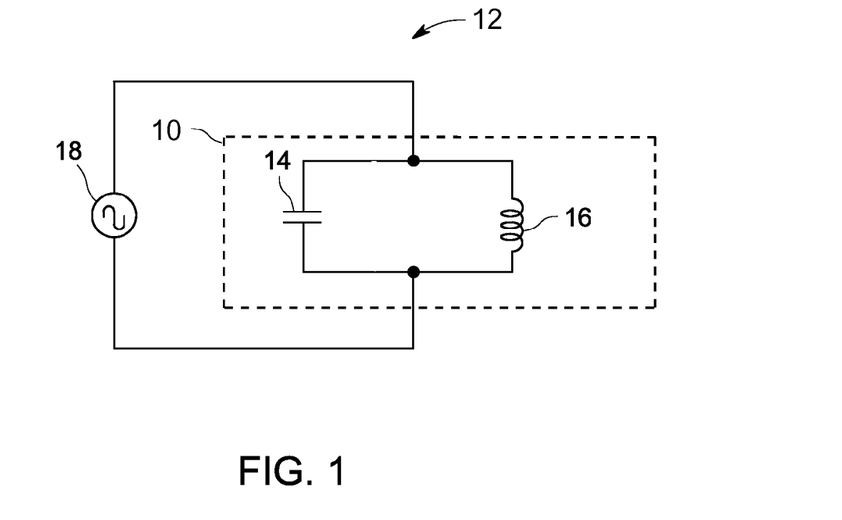
FIG. 1 is a simplified schematic illustration of an exemplary tank circuit formed in accordance various embodiments.

FIG. 1 is schematic illustration of an exemplary tank circuit 10 that forms a portion of an exemplary RF coil 12. A tank circuit, as used herein, is a resonant or tuned circuit that includes a capacitor 14 and an inductor 16. The tank circuit 10 may also be referred to herein as a parallel resonant tank. During operation, when an electric current, represented by the source 18, is transmitted through the tank circuit 10, the electric current can alternate between the capacitor 14 and the inductor 16 at the resonant frequency f of the tank circuit 10 During operation, when the reactance of the capacitor 14 is substantially equal to the reactance of the inductor 16, the tank circuit 10 is in resonance. Thus, the values of the capacitor 14 and the inductor 16 are selected based on the desired system resonant frequency f.

More specifically, because inductive reactance increases with an increasing system frequency f, and capacitive reactance decreases with an increase in the system frequency f, there is a frequency wherein the capacitive reactance is substantially equal to the inductive reactance. In the exemplary embodiment, the inductive reactance $X_L$ of the inductor 16 may be determined in accordance with:

$$X_L = 2\pi f_0 L;\qquad\text{Equation 1}$$

where: f is the system frequency; and
L is the inductance value of the inductor 16.
The capacitive reactance $X_C$ of the capacitor 14 may be determined in accordance with:

$$X_C = \frac{1}{2\pi fC} \qquad\text{Equation 2}$$

$$2\pi fL = \frac{1}{2\pi fC} \qquad\text{Equation 3}$$

where: f is the system frequency; and
C is the capacitance value of the capacitor 14.

In the exemplary embodiment, if the tank circuit 10 forms a portion of the RF coil 12, then the system frequency is predetermined based on the operational frequency of the system in which the RF coil 12 is utilized. For example, in one embodiment, the RF coil 12 is configured to be utilized with an MRI imaging system. Therefore, the resonant frequency of the tank circuit 10 is determined based on the system frequency f of the MRI imaging system. Because capacitors, such as the capacitor 14 for example, form a portion of the RF coil 12 and are utilized to tune the RF coil, the capacitance value of the capacitor 14 is typically predetermined and remains unchanged. Therefore, because the system frequency f and the value of the capacitor 14 is generally known and fixed, an inductor, such as inductor 16, having an inductance value that enables the tank circuit 10 to resonate at the system frequency f is coupled in parallel with the capacitor 14.

More specifically, if the system frequency f is known, and the capacitance value of the capacitor selected to be used with the inductor assembly is known, the value of the inductor may be determined in accordance with:

$$L = \frac{1}{(2\pi f)^2 C} \qquad\text{Equation 4}$$

For example, assuming that the system resonant frequency f is determined to be 128 MegaHertz (MHz). Moreover, assuming for example that the capacitance value of the capacitor 14 selected to be used with the system is 10 picoFarads (pF), then the resulting inductance of the inductor 16 is determined in accordance with:

$$L = \frac{1}{(2\pi * 128 * 10^6)^2 * (10 * 10^{-12})} \qquad\text{Equation 5}$$

Figure 2:
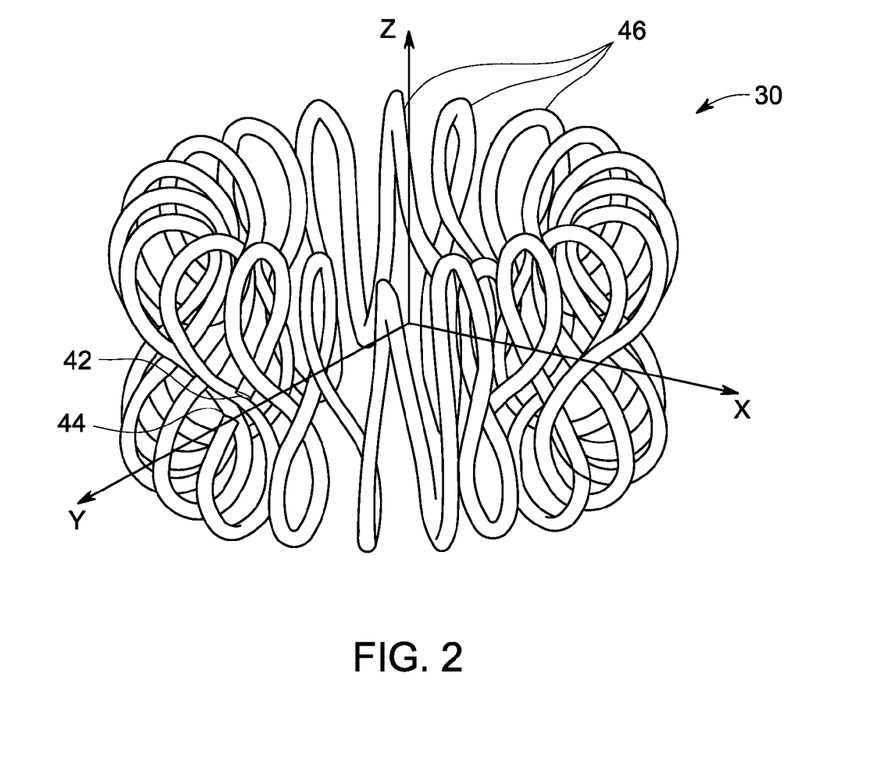
FIG. 2 is a top perspective view of an exemplary inductor assembly formed in accordance with various embodiments.
Figure 3:
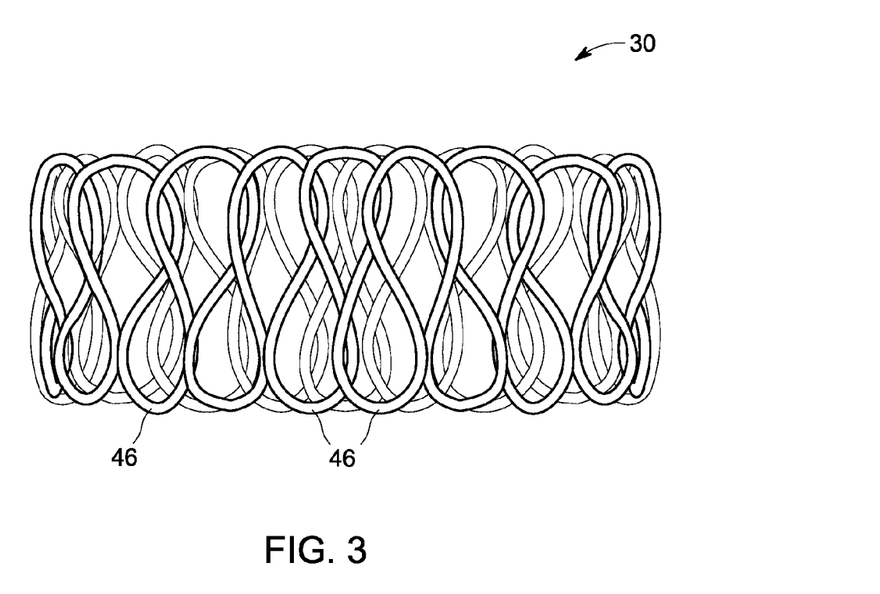
FIG. 3 is a side view of the exemplary inductor assembly shown in FIG. 2.
Figure 4:
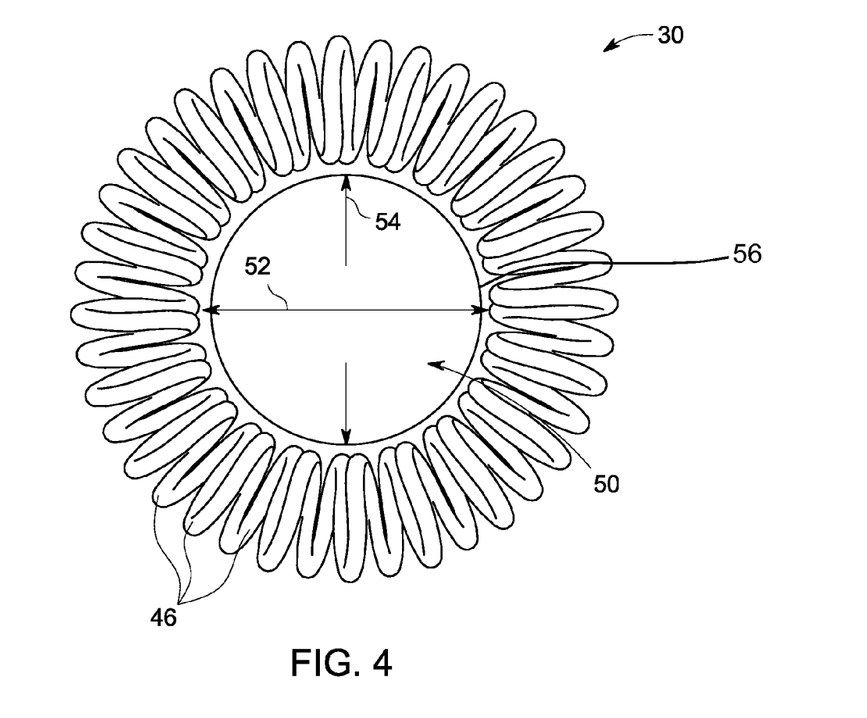
FIG. 4 is a top view of the exemplary inductor assembly shown in FIG. 2.

FIG. 2 is a perspective view of an exemplary inductor assembly 30 that may be used with the tank circuit 10 shown in FIG. 1 in accordance with various embodiments. FIG. 3 is a side view of the exemplary inductor assembly 30 shown in FIG. 2. FIG. 4 is a top view of the exemplary inductor assembly 30 shown in FIG. 2. As shown in FIG. 2, the inductor assembly 30 is illustrated with respect to an X-axis, a Y-axis, and a Z-axis. In the exemplary embodiment, the X-axis and the Y-axis lie along a plane intersecting the locus of the points forming the curved electrical conductor portions, which in this embodiment, are figure 8 shaped curves. Moreover, the Z-axis is normal to the X-axis and the Y-axis.

Accordingly, the inductor assembly 30 includes an electrical conductor 40 having a first end 42 and an opposing second end 44. During fabrication, the conductor 40 is formed into a lemniscate-shaped inductor. Lemniscate-shaped, as used herein, refers to an inductor that includes a plurality of figure-eight or ∞ shaped curves. Accordingly, the inductor assembly 30 includes a plurality of turns 46 that each have a substantially figure 8 shape. The quantity of turns 46 is determined based on the desired inductance value selected for the inductor assembly 30. For example, the inductor assembly 30 includes N turns 46 generating or defining a predetermined self-inductance. To increase the self-inductance, the inductor assembly 30 includes more turns 46. To decrease the self-inductance, the inductor assembly 30 includes less turns 46. It should be realized that increasing or decreasing the quantity of turns 46, increases or decreases the overall length of the conductor 40, thus changing the self-inductance value of the inductor assembly 30.

As shown in FIG. 2, the conductor 40 includes N turns 46, wherein each turn 46 spans approximately 360 degrees. Thus, the conductor 40 has an overall length that is approximately N*360 degrees. In the exemplary embodiment, the first end 42 and the opposing second end 44 are each coupled to a capacitor, such as the capacitor 14, shown in FIG. 1.

Referring to FIG. 4, the inductor assembly 30 has an opening 50 extending therethrough. The opening 50 is formed along the Z-axis. The opening 50 has a diameter 52. In the exemplary embodiment, the diameter 52 is substantially similar to an outer diameter 54 of an exemplary RF cable 56. Accordingly, in this embodiment, the RF cable 56 is configured to be inserted through the opening 50 such that the inductor assembly 30 substantially circumscribes the RF cable 56.

Figure 5:
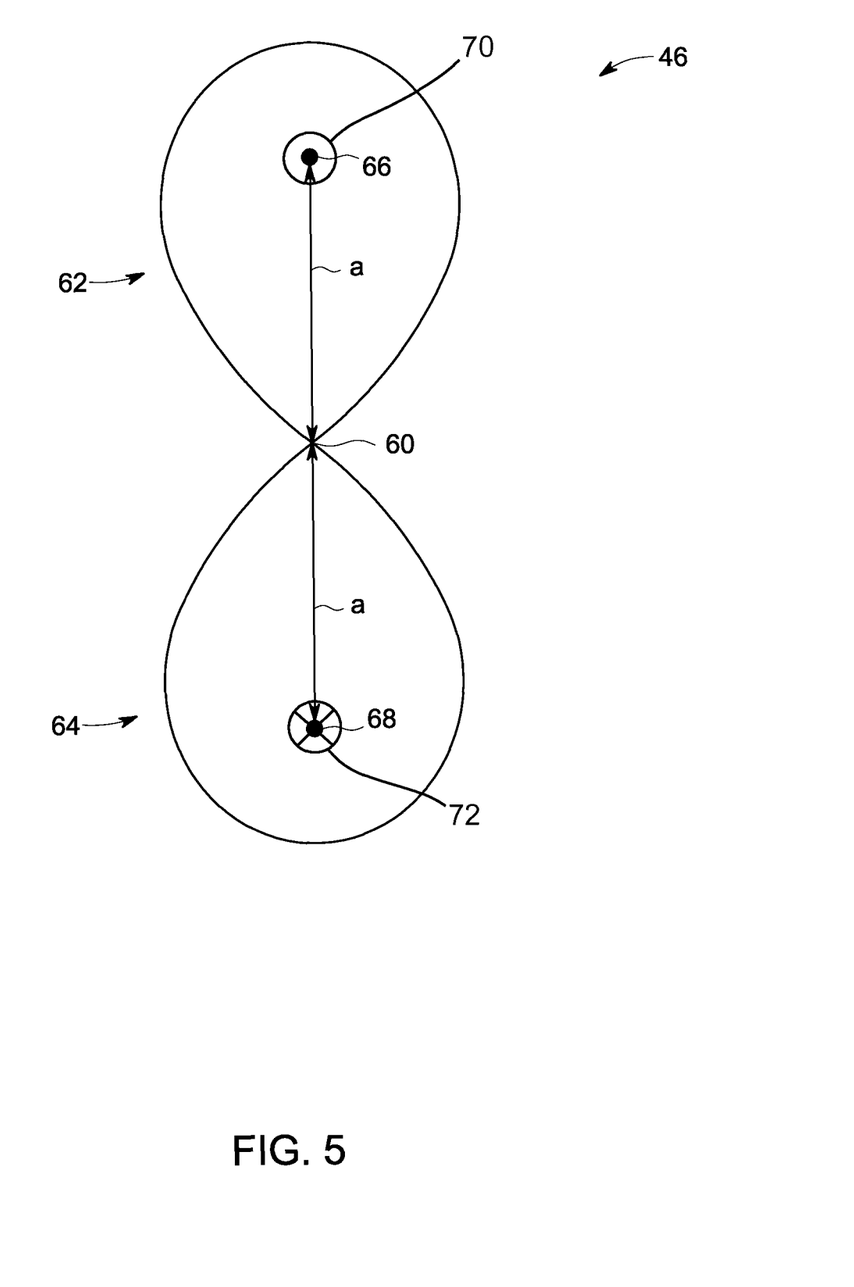
FIG. 5 is a side view of a portion of the exemplary inductor shown in FIGS. 2-4.

FIG. 5 is a side view of a single turn 46 of the inductor assembly 30 shown in FIGS. 2-4. In the exemplary embodiment, the turn 46 is formed as a figure 8 to include a first lobe 62 and a second lobe 64. The magnetic flux 70 in the first lobe 62 is oriented in an opposite direction to the magnetic flux 72 in the second lobe 64. Thus, the additional magnetic dipole radiation generated by the tilt of the conductor 40 is substantially cancelled out. In one embodiment, the magnetic flux 70 is extending upward from the page and the magnetic flux 72 is shown as extending down into the page of FIG. 5.

Each turn 46 includes a locus 60 that is formed from two fixed points 66 and 68, e.g. referred to as foci. In the exemplary embodiment, the lemniscate is a plane curve defined from two given points $F_1$ (66) and $F_2$ (68) known as foci, at distance $2a$ from each other as the locus of points P such that $PF_1 \cdot PF_2 = a^2$. Thus, each turn 46 is overlapping at the locus 60 and has a shape similar to the numeral 8 and/or to the $\infty$ symbol. The lemniscate may be formed using the inverse transform of a hyperbola, with the inversion circle centered at the center of the hyperbola, e.g. at locus 60.

As discussed above, it is desirable to form an inductor having a substantially zero overall magnetic moment while maintaining a certain self-inductance. For example, in Magnetic Resonance Imaging (MRI) systems, the RF coupling properties of reactive components like inductors and capacitors used for building the phased array coils. Therefore, it is desirable to utilize an inductor that is substantially "invisible" to RF radiation. RF invisibility, as used herein, may mean an inductor, such as inductor assembly 30, having a relatively confined magnetic field pattern.

For example, the receiving and transmitting characteristics of a conventional closed contour antenna may be described through magnetic and electric multipolar expansion of the magnetic and electric field, respectively. A transmit and receive antenna must therefore have a very high electric and magnetic moments. Thus, to fabricate an "invisible" inductor, such as inductor assembly 30, the minimization of the magnetic dipole radiation in the first degree, the quadrupole radiation in the second degree, etc. are considered.

Accordingly, in the exemplary embodiment, the magnetic dipole of the inductor assembly 30 is defined as:

$$m = \tfrac{1}{2} \int r \times j \, dv \qquad \text{Equation 6}$$

where: m is the magnetic dipole;
r is a radius vector; and
j is a current vector.

Assuming that the inductor assembly 30 is represented in space on a three-dimensional coordinate system, then every point on the inductor assembly 30 is defined by a radius vector r. The radius vector r begins at the origin of the coordinate system and ends at a point on the inductor assembly 30. Thus, there is a radius vector r for each point on the inductor assembly 30. Additionally, j is the current at each point r on the inductor assembly 30. In the exemplary embodiment, the j vector points in a direction that is tangential to the direction of the r vector. Therefore, the cross-product of r and j are integrated to generate another vector that represents the magnetic moment. As shown in Equation 6, the cross-products of r and j are integrated over the entire inductor assembly 30 to generate a plurality of magnetic moments for the inductor 30.

The inductance of the inductor assembly 30 is then defined in accordance with:

$$L = \frac{\mu_0}{4\pi} \int \int \frac{j(r)j(r')}{|r - r'|} dr \, dr' \qquad \text{Equation 7}$$

where: L is the self-inductance of the inductor assembly 30:
r is a first point on the inductor assembly 30;
r' is a second different point on the inductor assembly 30; and
$\mu_0$ is the permeability of air in a vacuum.

During operation, by minimizing the magnetic dipole in Equation 6 and maximizing the inductance in Equation 7, the inductor assembly 30 has a relatively low RF emissivity (receptivity) and a relatively high self-inductance. Thus, referring again to FIG. 5, during operation, the magnetic flux is oriented in opposite directions in the two lobes 62 and 64 of the figure 8 shaped lemniscate and the additional magnetic dipole radiation generated by the tilt of the conductor 40 is substantially cancelled out. The tilt represents the angle of the conductor 40 as it is wound in the lemniscate shape. More specifically, as shown in FIG. 2 the conductor 40 is wound such that a portion of the conductor 40 is offset from Z-axis. That is, the conductor is not completely perpendicular to the X axis and the Y-axis. This offset is referred to herein as the tilt.

In the exemplary embodiment, the self-inductance of the inductor assembly 30 is illustrated using Table 1 shown below.

TABLE 1

|  | Bobbin | Torus | Inductor Assembly 30 |
|---|---|---|---|
| Mx, (μAm) | 0 | 0 | 0 |
| My, (μAm) | 15 | 0 | 0 |
| Mz, (μAm) | 452.2 | 56.2 | 30.6 |
| L, (nH) | 203.4 | 91.2 | 55.9 |

Mx is the magnetic moment along the x-axis. My is the magnetic moment along the y-axis, and Mz is the magnetic moment along the z-axis, all shown in FIG. 2. As shown in Table 1, the magnetic moment along both the x-axis and the y-axis of the inductor assembly 30 is substantially 0. Moreover, the overall self-inductance of the inductor assembly 30 is substantially less then the self-inductance of either the bobbin inductor or the torus inductor. Accordingly, the inductor assembly 30 has a highly confined magnetic field, while still providing improved inductive characteristics.

Figure 6:
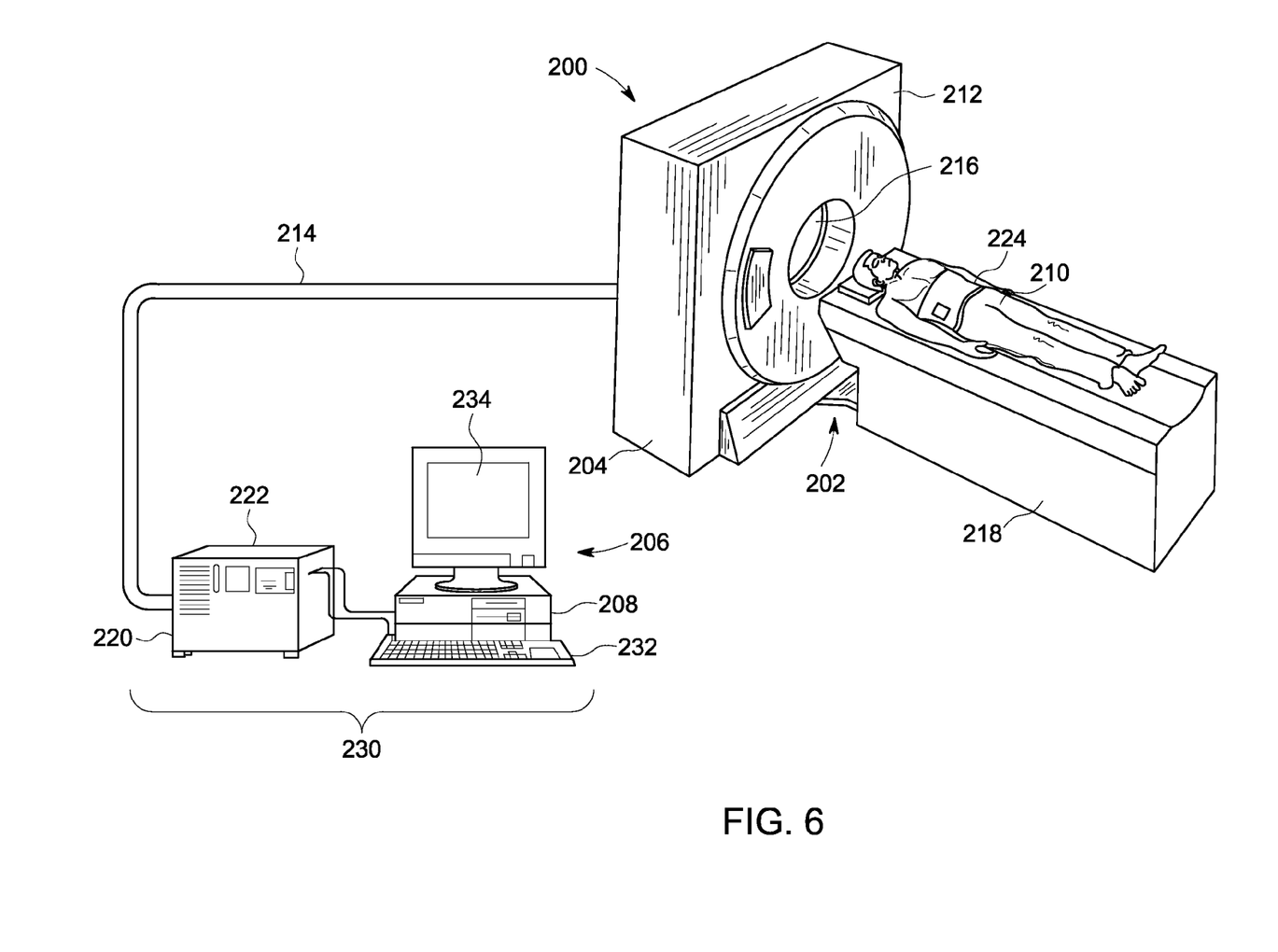
FIG. 6 is a pictorial view of an exemplary medical imaging system that may be utilized with an exemplary inductor assembly formed in accordance with various embodiments.

Various embodiments of the inductor described herein may be provided as part of, or used with, a medical imaging system, such as imaging system 200 shown in FIG. 6. It should be appreciated that although the imaging system 200 is illustrated as a single modality imaging system, the various embodiments may be implemented in or with multi-modality imaging systems. The imaging system 200 is illustrated as an MRI imaging system and may be combined with different types of medical imaging systems, such as a Computed Tomography (CT). Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 6, the imaging system 200 includes an imaging portion 202 having an imaging unit 204 (e.g., imaging scanner) and a processing portion 206 that may include a processor 208 or other computing or controller device. In particular, the imaging unit 204 enables the imaging system 200 to scan an object or patient 210 to acquire image data, which may be image data of all or a portion of the object or patient 210. The imaging unit 204 includes a gantry 212 having one or more imaging components (e.g., magnets or magnet windings within the gantry 212) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 206 via a communication link 214 that may be wired or wireless. During an imaging scan by the imaging unit 204, the gantry 212 and the imaging components mounted thereon or therein may remain stationary or rotate about or along a center of rotation defining an examination axis through a bore 216. The patient 210 may be positioned within the gantry 212 using, for example, a motorized table 218.

In operation, an output of one or more of the imaging components is transmitted to the processing portion 206, and vice versa, which may include transmitting signals to or from the processor 208 through a control interface 220. The processor 208 also may generate control signals for controlling the position of the motorized table 218 or imaging components based on user inputs or a predetermined scan. During a scan, image data, such as magnetic resonance image data from the imaging components may be communicated to the processor 208 through a data interface 222 via the control interface 220, for example, as acquired by the surface coil 224, illustrated as a torso surface coil array in FIG. 6.

The processor 208 and associated hardware and software used to acquire and process data may be collectively referred to as a workstation 230. The workstation 230 includes a keyboard 232 and/or other input devices such as a mouse, a pointer, and the like, and a display device 234. The display device 234 displays image data and may accept input from a user if a touchscreen is available.

Figure 7:
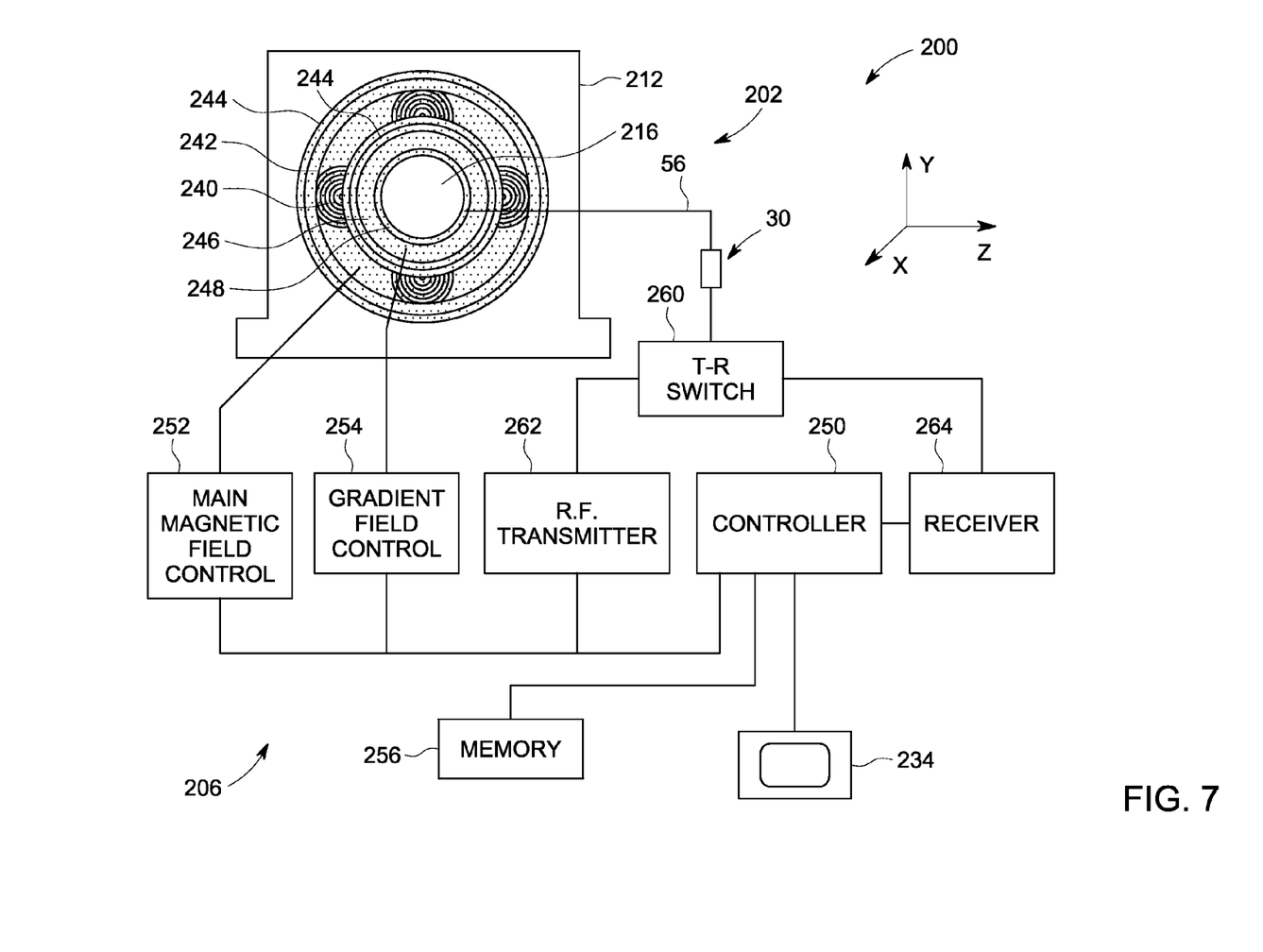
FIG. 7 is a schematic block diagram of the medical imaging system shown in FIG. 6.

FIG. 7 is a schematic block illustration of the imaging system 200 shown in FIG. 6. In the exemplary embodiment, the imaging system 200 also includes a superconducting magnet 240 formed from magnetic coils supported on a magnet coil support structure. However, in other embodiments, different types of magnets may be used, such as permanent magnets or electromagnets. A vessel 242 (also referred to as a cryostat) surrounds the superconducting magnet 240 and is filled with liquid helium to cool the coils of the superconducting magnet 240. A thermal insulation 244 is provided surrounding the outer surface of the vessel 242 and the inner surface of the superconducting magnet 240. A plurality of magnetic gradient coils 246 are provided within the superconducting magnet 240 and an RF transmit coil 248 is provided within the plurality of magnetic gradient coils 246. In some embodiments the RF transmit coil 248 may be replaced with a transmit and receive coil as described in more detail herein. The components within the gantry 212 generally form the imaging portion 202. It should be noted that although the superconducting magnet 240 is a cylindrical shaped, other shapes of magnets can be used.

The processing portion 206 also generally includes a controller 250, a main magnetic field control 252, a gradient field control 254, a memory 256, the display device 234, a transmit-receive (T-R) switch 260, an RF transmitter 262 and a receiver 264. In the exemplary embodiment, the RF cable 56 is coupled between the TR switch 260 and the gantry 212. Moreover, the RE cable 56 is configured to be inserted through the opening 50 of the inductor assembly 30, such that the inductor assembly 30 substantially circumscribes the RF cable 56.

In operation, a body of an object, such as the patient 210 (shown in FIG. 6) or a phantom to be imaged, is placed in the bore 216 on a suitable support, for example, the motorized table 218 (shown in FIG. 6) or other patient table. The superconducting magnet 240 produces a uniform and static main magnetic field $B_o$ across the bore 216. The strength of the electromagnetic field in the bore 216 and correspondingly in the patient 210, is controlled by the controller 250 via the main magnetic field control 252, which also controls a supply of energizing current to the superconducting magnet 240.

The magnetic gradient coils 246, which include one or more gradient coil elements, are provided so that a magnetic gradient can be imposed on the magnetic field $B_o$ in the bore 216 within the superconducting magnet 240 in any one or more of three orthogonal directions x, y, and z. The magnetic gradient coils 246 are energized by the gradient field control 254 and are also controlled by the controller 250.

The RF transmit coil 248, which may include a plurality of coils (e.g., resonant surface coils), is arranged to transmit magnetic pulses and/or optionally simultaneously detect MR signals from the patient 210 if receive coil elements are also provided, such as the surface coil 224 (shown in FIG. 6) configured as an RF receive coil. Moreover, the inductor assembly described herein may be coupled between pairs of transmit or receive coils as described in FIG. 7. The RF transmit coil 248 and the receive surface coil 224 are selectably interconnected to one of the RF transmitter 262 or receiver 264, respectively, by the T-R switch 260. The RF transmitter 262 and T-R switch 260 are controlled by the controller 250 such that RF field pulses or signals are generated by the RF transmitter 262 and selectively applied to the patient 210 for excitation of magnetic resonance in the patient 210. In the exemplary embodiment, any of the inductor assemblies described herein, may be utilized with the RF coils shown in FIG. 8.

Following application of the RF pulses, the T-R switch 260 is again actuated to decouple the RF transmit coil 248 from the RF transmitter 262. The detected MR signals are in turn communicated to the controller 250. The controller 250 includes a processor (e.g., image reconstruction processor), for example, the processor 208 (shown in FIG. 14), that controls the processing of the MR signals to produce signals representative of an image of the patient 210.

The processed signals representative of the image are also transmitted to the display device 234 to provide a visual display of the image. Specifically, the MR signals fill or form a k-space that is Fourier transformed to obtain a viewable image. The processed signals representative of the image are then transmitted to the display device 234.

A technical effect of the inductor described herein is to provide an inductor having an improved magnetic field confinement. The inductor is formed into a lemniscate shape such that the magnetic flux is oriented in opposite directions in the two lobes of the lemniscate inductor. Thus, the additional magnetic dipole radiation generated by the tilt of the wire is cancelled out. The inductor of various embodiments described herein has a compact shape and does not utilize shielding because the magnetic field is substantially confined within the inductor. In operation, the magnetic field lines are oriented in opposite directions in the upper and lower sides of the figure "8" shaped cross-section, thus causing the residual magnetic dipole radiation to cancel out. The inductor assembly, in one exemplary embodiment, is installed around an RF cable 57.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. An inductor comprising:
    an electrical conductor having a first end and an opposite second end; and
    a plurality of turns forming the electrical conductor, each of the plurality of turns having a first lobe and a second lobe, each of the plurality of turns further having a lemniscate shape, with the electrical conductor being wrapped around a central axis.

2. An inductor in accordance with claim 1 further comprising an opening extending therethrough, the opening being sized to receive an RF cable therethrough.

3. An inductor in accordance with claim 1 wherein the first and second ends are configured to be electrically coupled to a capacitor.

4. An inductor in accordance with claim 1 wherein the a magnetic flux if the first lobe is oriented in a first direction and the magnetic flux in the second lobe is oriented in an opposite second direction.

5. An inductor in accordance with claim 1 wherein the magnetic flux generated in the first lobe is substantially the same as the magnetic flux generated in the second lobe such that the magnetic flux in the first lobe substantially cancels the magnetic flux in the second lobe.

6. An inductor in accordance with Claim 1 wherein the first lobe is symmetrical with the second lobe.

7. An inductor in accordance with claim 1 wherein the inductor comprises N figure 8 turns, the quantity of turns based on a predetermined inductance value and wherein each of the plurality of turns is at a different arc position about the central axis.

8. A Radio Frequency (RF) coil comprising:
    a capacitor; and
    an inductor coupled to the capacitor, the inductor assembly including
    an electrical conductor having a first end and an opposite second end; and
    a plurality of turns forming the electrical conductor, each of the plurality of turns having a first lobe and a second lobe, each of the plurality of turns further having a lemniscate shape, with the electrical conductor being wrapped around a central axis.

9. The RF coil in accordance with claim 8 wherein the inductor further comprises an opening extending therethrough, the opening being sized to receive an RF cable therethrough.

10. The RF coil in accordance with claim 8 wherein the first and second ends are configured to be electrically coupled in parallel with the capacitor.

11. The RF coil in accordance with claim 8 wherein the first lobe has a magnetic flux being oriented in a first direction and the second lobe has a magnetic flux being oriented in an opposite second direction.

12. The RF coil in accordance with claim 8 wherein a magnetic flux generated in the first lobe is substantially the same as a magnetic flux generated in the second lobe such that the magnetic flux in the first lobe substantially cancels the magnetic flux in the second lobe.

13. The RF coil in accordance with claim 8 wherein the first lobe is symmetrical with the second lobe.

14. The RF coil in accordance with claim 8 wherein the inductor comprises N figure 8 turns, the quantity of turns based on a predetermined inductance value and wherein each of the plurality of turns is at a different arc position about the central axis.

15. A Magnetic Resonance Imaging (MRI) system comprising:
    at least one RF coil, said RF coil comprising:
    a capacitor; and
    an inductor coupled to the capacitor, the inductor assembly including
    an electrical conductor having a first end and an opposite second end; and
    a plurality of turns forming the electrical conductor, each of the plurality of turns having a first lobe and a second lobe, each of the plurality of turns further having a lemniscate shape, with electrical conductor being wrapped around a central axis.

16. The MRI system in accordance with claim 15, wherein the inductor further comprises an opening extending therethrough, the opening being sized to receive an RF cable therethrough.

17. The MRI system in accordance with claim 15, wherein the first and second ends are configured to be electrically couple the inductor in parallel with the capacitor.

18. The MRI system in accordance with claim 15, wherein the first lobe has a magnetic flux being oriented in a first direction and the second lobe has a magnetic flux oriented in an opposite second direction.

19. The MRI system in accordance with claim 15, wherein the magnetic flux generated in the first lobe is substantially the same as the magnetic flux generated in the second lobe such that the magnetic flux in the first lobe substantially cancels the magnetic flux in the second lobe.

20. The MRI system in accordance with claim 15, wherein the first lobe is symmetrical with the second lobe.

* * * * *